(12) United States Patent
Yao et al.

(10) Patent No.: US 9,484,523 B2
(45) Date of Patent: Nov. 1, 2016

(54) BISTABLE PIEZOELECTRIC CANTILEVER VIBRATION ENERGY GENERATOR BASED ON SPHERICAL COMPOSITE STRUCTURE AND PARTIAL SEPARATION OF DIFFERENT LAYERS

(71) Applicant: Beijing University of Technology, Beijing (CN)

(72) Inventors: Minghui Yao, Beijing (CN); Yinbo Li, Beijing (CN); Wei Zhang, Beijing (CN)

(73) Assignee: Beijing University of Technology, Beijing (CN)

( * ) Notice: Subject to any disclaimer, the term of this patent is extended or adjusted under 35 U.S.C. 154(b) by 24 days.

(21) Appl. No.: 14/759,179

(22) PCT Filed: Nov. 24, 2014

(86) PCT No.: PCT/CN2014/091997
§ 371 (c)(1),
(2) Date: Jul. 2, 2015

(87) PCT Pub. No.: WO2015/106601
PCT Pub. Date: Jul. 23, 2015

(65) Prior Publication Data
US 2016/0254437 A1    Sep. 1, 2016

(30) Foreign Application Priority Data

Sep. 24, 2014 (CN) ............... 2014 1 0492259
Sep. 24, 2014 (CN) ............... 2014 1 0494118

(51) Int. Cl.
*H01L 41/047* (2006.01)
*H01L 41/113* (2006.01)
*H02N 2/18* (2006.01)
*H01L 41/053* (2006.01)
*H01L 41/083* (2006.01)

(52) U.S. Cl.
CPC ....... *H01L 41/1136* (2013.01); *H01L 41/0471* (2013.01); *H01L 41/053* (2013.01); *H01L 41/083* (2013.01); *H02N 2/188* (2013.01)

(58) Field of Classification Search
CPC .................. H01L 41/1136; H01L 41/1138
USPC .......... 1/1; 600/437, 444, 445; 310/330, 332, 310/339, 365
See application file for complete search history.

(56) References Cited

U.S. PATENT DOCUMENTS

| | | | | |
|---|---|---|---|---|
| 6,480,183 B1* | 11/2002 | Van Ruymbeke | ..... | G05G 9/047 324/660 |
| 2014/0203685 A1* | 7/2014 | Vandenba Viere | .. | H02K 41/031 310/323.02 |

FOREIGN PATENT DOCUMENTS

| CN | 101908837 A | 12/2010 |
|---|---|---|
| CN | 102013837 A | 4/2011 |

(Continued)

*Primary Examiner* — Thomas Dougherty
*Assistant Examiner* — Karen B Addison
(74) *Attorney, Agent, or Firm* — Tian IP & Technology, LLC.

(57) ABSTRACT

Implementations herein relate to a bistable piezoelectric cantilever vibration energy generator based on spherical composite structure with partial separation of different layers that includes a beam bracket and a shell. The shell is spherical, the bottom of the shell has a circular opening. The beam bracket and the shell are fixed to the base respectively. Vibration of the beam bracket can cause deformation of the piezoelectric cantilever beam, the piezoelectric cantilever beam generates electrical energy using the piezoelectric effect during deformation. The bistable piezoelectric cantilever vibration energy generator further includes twenty-five piezoelectric oscillator structures, and the lengths of the cantilever beam in the same layer are different such as to form a wide resonance frequency domain and to substantially increase power generation.

5 Claims, 9 Drawing Sheets

(56) References Cited

FOREIGN PATENT DOCUMENTS

| CN | 201854207 U | 6/2011 |
| CN | 102790547 A | 11/2012 |
| CN | 102790548 A | 11/2012 |
| JP | 2012191787 A | 10/2012 |
| WO | WO2010151738 | 12/2010 |
| WO | WO2014076895 A | 5/2014 |

* cited by examiner

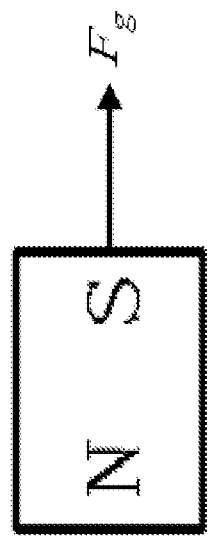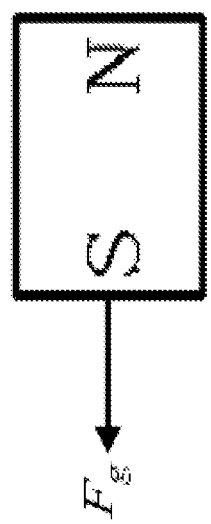
FIG. 7

US 9,484,523 B2

BISTABLE PIEZOELECTRIC CANTILEVER VIBRATION ENERGY GENERATOR BASED ON SPHERICAL COMPOSITE STRUCTURE AND PARTIAL SEPARATION OF DIFFERENT LAYERS

CROSS REFERENCE TO RELATED APPLICATION

This application is a national stage application of International application number PCT/CN2014/091997, filed Nov. 24, 2014, titled "Bistable Piezoelectric Cantilever Vibration Energy Generator Based on Spherical Composite Structure and Partial Separation of Different Layers," which claims the priority benefit of Chinese Patent Application Nos. 201410492259.2 and 201410494118.4, filed on Sep. 24, 2014, which are hereby incorporated by reference in their entirety.

TECHNICAL FIELD

The present disclosure relates to a bistable piezoelectric cantilever vibration energy generator based on spherical composite structure and partial separation of different layers. The generator can effectively collect ambient mechanical energy to generate electricity. The present disclosure may be implemented in the areas of environmental protection and new energy.

BACKGROUND

With rapid development of microelectronics and wireless networks, capturing energy from the environment for low-power appliances or battery-powered devices has become an urgent requirement. The conventional battery-powered with a series disadvantages, such as short-lived, require periodic replacement and pollute the environment. These problems seriously affect the development of microelectronics technology. Therefore, using ambient vibration produce energy is necessary.

The piezoelectric cantilevered oscillator has large amplitude, low vibration frequency domain, its practicability is obvious (Chinese Patent Publication No. CN102790547A) discloses a bistable piezoelectric cantilever generator, a device arranges two symmetrical bistable piezoelectric cantilever vibrators, effectively improves the power generation (Chinese Patent Publication No. CN102790548A) discloses a bistable composite piezoelectric cantilever generator, the present disclosure has eight bistable piezoelectric oscillators and arranged on the cylinder, which effectively improves the power generation (PCT Publication No. WO2010151738A3) discloses a bistable piezoelectric cantilever device, which effectively broadens the resonance frequency domain, but the extent of the bandwidth expansion is not obvious.

SUMMARY

In order to effectively broaden the effective frequency domain of the piezoelectric power generating device and to increase the bandwidth, decrease the resonance frequency and increase the voltage, the present disclosure relates to a bistable piezoelectric cantilever vibration energy generator based on spherical composite structure and partial separation of different layers. The generator includes twenty-five piezoelectric oscillator in a small space and the piezoelectric layer and the base layer are partially separated. This can effectively increase the power-generating capacity and reduce the volume of power generation device to make it fit to MEMS development.

In order to solve above problems, the technical solution of the present disclosure is a bistable piezoelectric cantilever vibration energy generator based on spherical composite structure and partial separation of different layers, wherein: the structure of this present disclosure includes a beam bracket and a shell. The shell is spherical, the bottom of the shell has a circular opening. The beam bracket and the shell are fixed to the base respectively.

The beam bracket includes a support bar, a fixed ball and a piezoelectric cantilever beam. The fixed ball is fixedly connected to the piezoelectric cantilever beam, and the support bar supports the fixed ball. The support bar is fixedly connected to the fixed balls. The number of the piezoelectric cantilever beam is twenty-five and the piezoelectric cantilever beam is divided into four layers, the first layer has only one piezoelectric cantilever beam, the second layer, third layer and the fourth layer has eight piezoelectric cantilever beams respectively, the piezoelectric cantilever beams of different layers are circular uniform distribution. The support bar is the support structure of the beam bracket, the support bar is provided in fixed ball and in the side far away with the piezoelectric cantilever of the first layer, the support bar fixedly connected to the fixed ball through the circular opening at the bottom of the shell.

The bistable piezoelectric cantilever vibrator structure may include a piezoelectric cantilever beam and a permanent magnet. The piezoelectric cantilever beam includes the first protective layer, the lead, the first piezoelectric layer, the base layer, the second protective layer, the second piezoelectric layer and the electrode. The order of the layers is as follow: the first protective layer, the first piezoelectric layer, the base layer, the second piezoelectric layer, the second protective layer. The layers are pasted together. The first protective layer and the first piezoelectric layer are completely pasted together, the first piezoelectric layer and the base layer are incompletely pasted together and separated at the end of the beam. The second protective layer and the second piezoelectric layer are completely pasted together, the second piezoelectric layer and the base layer are incompletely pasted together and separated at the end of the beam. The length of the separation section is about 20% to 50% of the total length. The first mass is pasted on the surface of the first protective layer of the piezoelectric cantilever beam, the second mass is pasted on the surface of the second protective layer of the piezoelectric cantilever beam. The lead is linked from the electrode is, the electric charge generated by the deformation of the piezoelectric cantilever beam will gather on the electrodes, the lead boots out the electric charge from the electrode and produces the electric current.

The permanent magnets includes the first permanent magnet and the second permanent magnet. The aspect of the first mass which keep away from the fixed side of the cantilever pasted with a first permanent magnet, the second permanent magnet is disposed opposite with the first permanent magnet. The first permanent magnet and the second permanent magnet are rectangular magnets and mutually exclusive. The second permanent magnet fixed to the inner wall of the shell.

The piezoelectric cantilever beam is a symmetrical structure, the length of the first protective layer is equal to that of the second protective layer, the width of the first protective layer is equal to that of the second protective layer, the length of the first piezoelectric layer is equal to that of the second piezoelectric layer, the width of the first piezoelectric layer is equal to that of the second piezoelectric layer. The length of the first piezoelectric layer is equal to that of the base layer, the width of the first piezoelectric layer is equal to that of the base layer, the purpose is to facilitate to paste and obtain a larger piezoelectric area. The length and width of the first protective layer are greater than that of the first piezoelectric layer. The bistable piezoelectric vibrators which are mutually symmetrical with each other with the same parameters, the bistable piezoelectric vibrators which are adjacent to each other with the different parameters. The lengths of the piezoelectric cantilever beams on the first layer are equal to that of the piezoelectric cantilever beams on the third layer, the widths of the piezoelectric cantilever beams on the first layer are equal to that of the piezoelectric cantilever beams on the third layer. The lengths of the piezoelectric cantilever beams on the second layer are equal to that of the piezoelectric cantilever beams on the forth layer, the widths of the piezoelectric cantilever beams on the second layer are equal to that of the piezoelectric cantilever beams on the forth layer. The lengths of the piezoelectric cantilever beams on the first layer are different with that of the piezoelectric cantilever beams on the third layer, the widths of the piezoelectric cantilever beams on the first layer are different with that of the piezoelectric cantilever beams on the third layer.

The piezoelectric cantilever vibrators on the same layer are connected in series, the piezoelectric cantilever vibrators on the different layer are connected in parallel.

Comparing with the prior art, the beneficial effects of this present disclosure are as follow.

First, when the piezoelectric device vibrate, the first protective layer, the first piezoelectric layer, the second protective layer, the second piezoelectric layer and base layer all will vibrate together. When the base layer moves to the maximum displacement, the first protective layer, the first piezoelectric layer, the second protective layer, the second piezoelectric layer all will continue move a distance, so that the first piezoelectric layer and the second piezoelectric layer produce secondary deformation, and there exist coupling between these two deformations. The secondary deformation and the coupling both increase the power generation capacity.

Second, the present disclosure includes twenty-five piezoelectric oscillators, and the piezoelectric cantilever vibrators on the same layer are connected in series, the piezoelectric cantilever vibrators on the different layer are connected in parallel, all of above broaden the effective bandwidth and significantly increase the power generation capacity.

Thirds, the twenty-five piezoelectric vibrators is fixed in the same sphere, which effectively reduce the volume of the piezoelectric generator and more suitable for the development need of MEMS products.

BRIEF DESCRIPTION OF THE DRAWINGS

FIG. 7 is a repulsion schematic between the first permanent magnet and the second permanent magnet in the same bistable piezoelectric cantilever vibrator.

Figure 1:
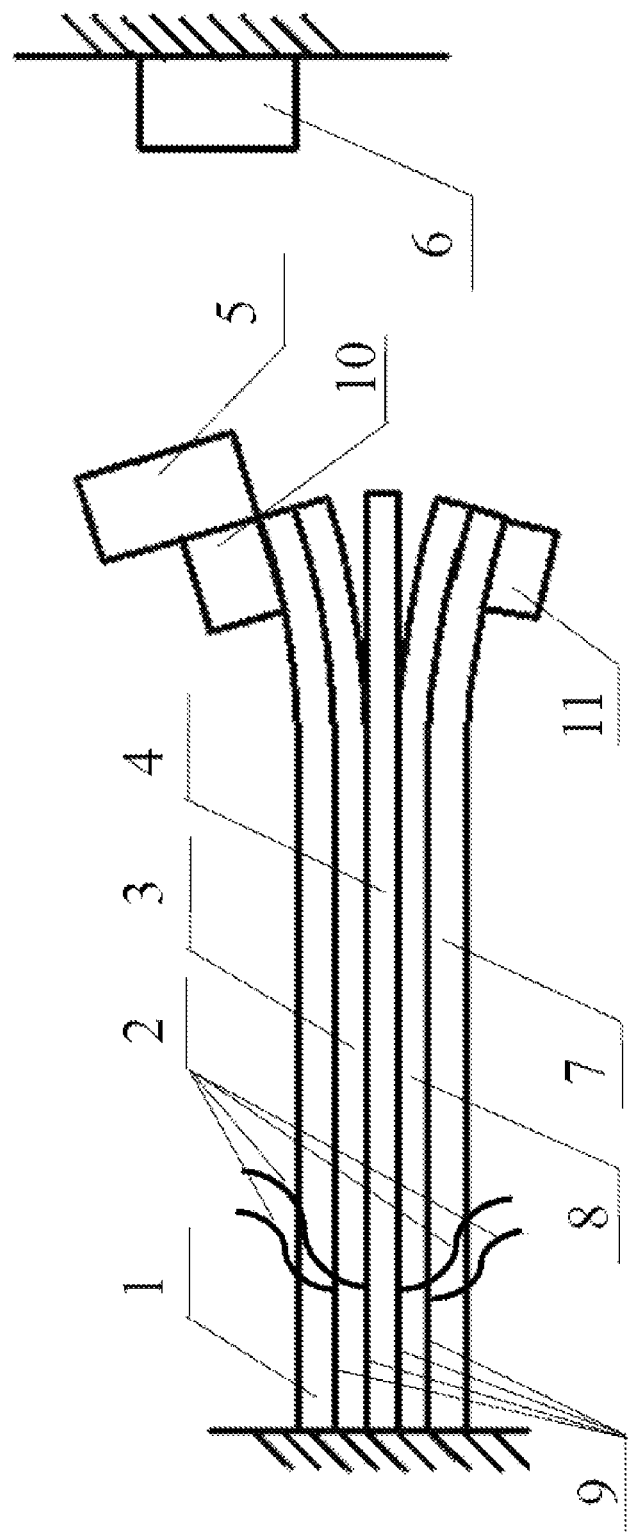
FIG. 1 is a front view of a bistable piezoelectric cantilever vibrator.
Figure 2:
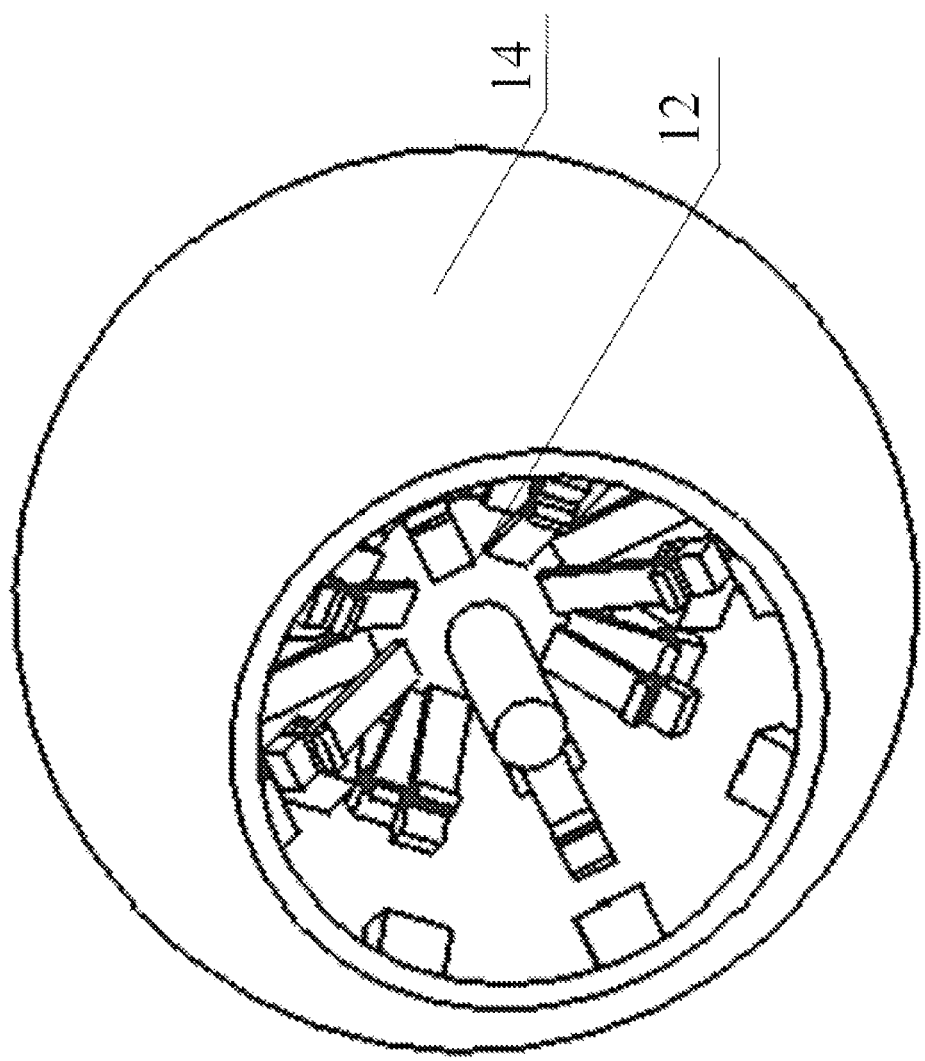
FIG. 2 is a structure diagram of a bistable piezoelectric cantilever vibration energy generator based on spherical composite structure and partial separation of different layers.
Figure 3:
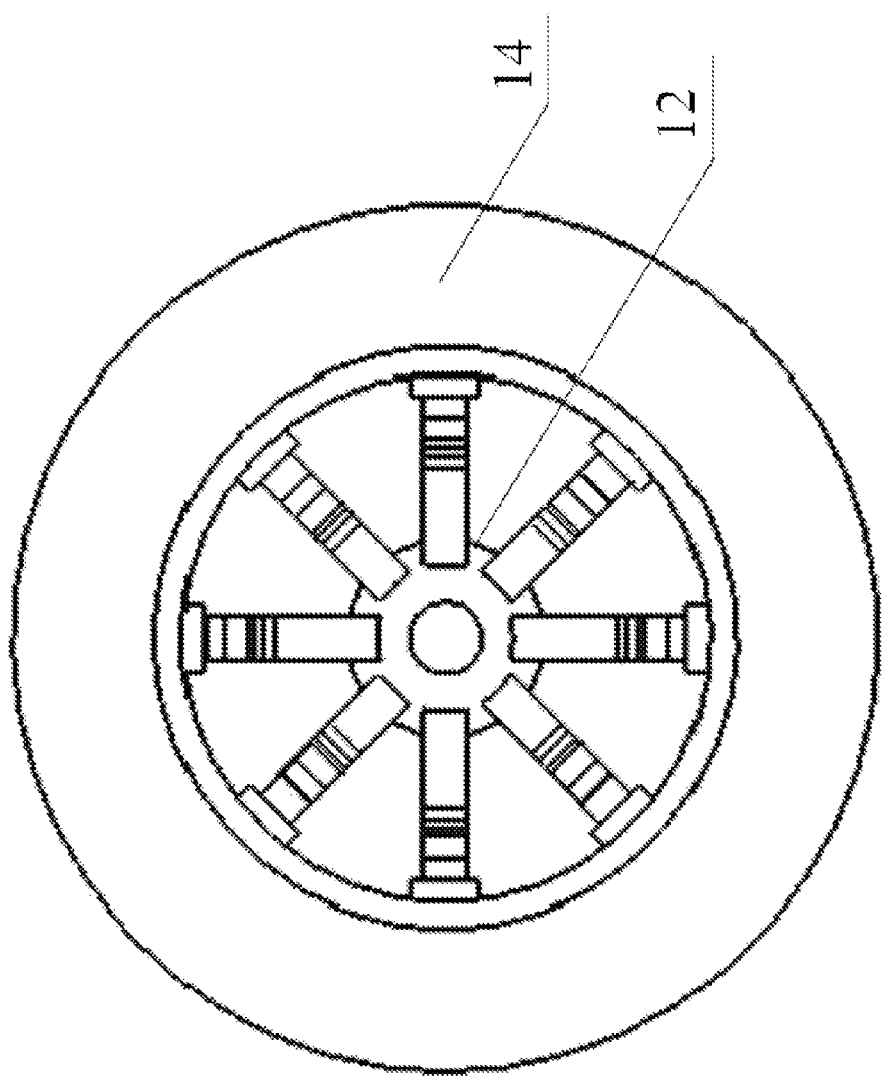
FIG. 3 is an upward view of the bistable piezoelectric cantilever vibration energy generator based on a spherical composite structure and partial separation of different layers.
Figure 4:
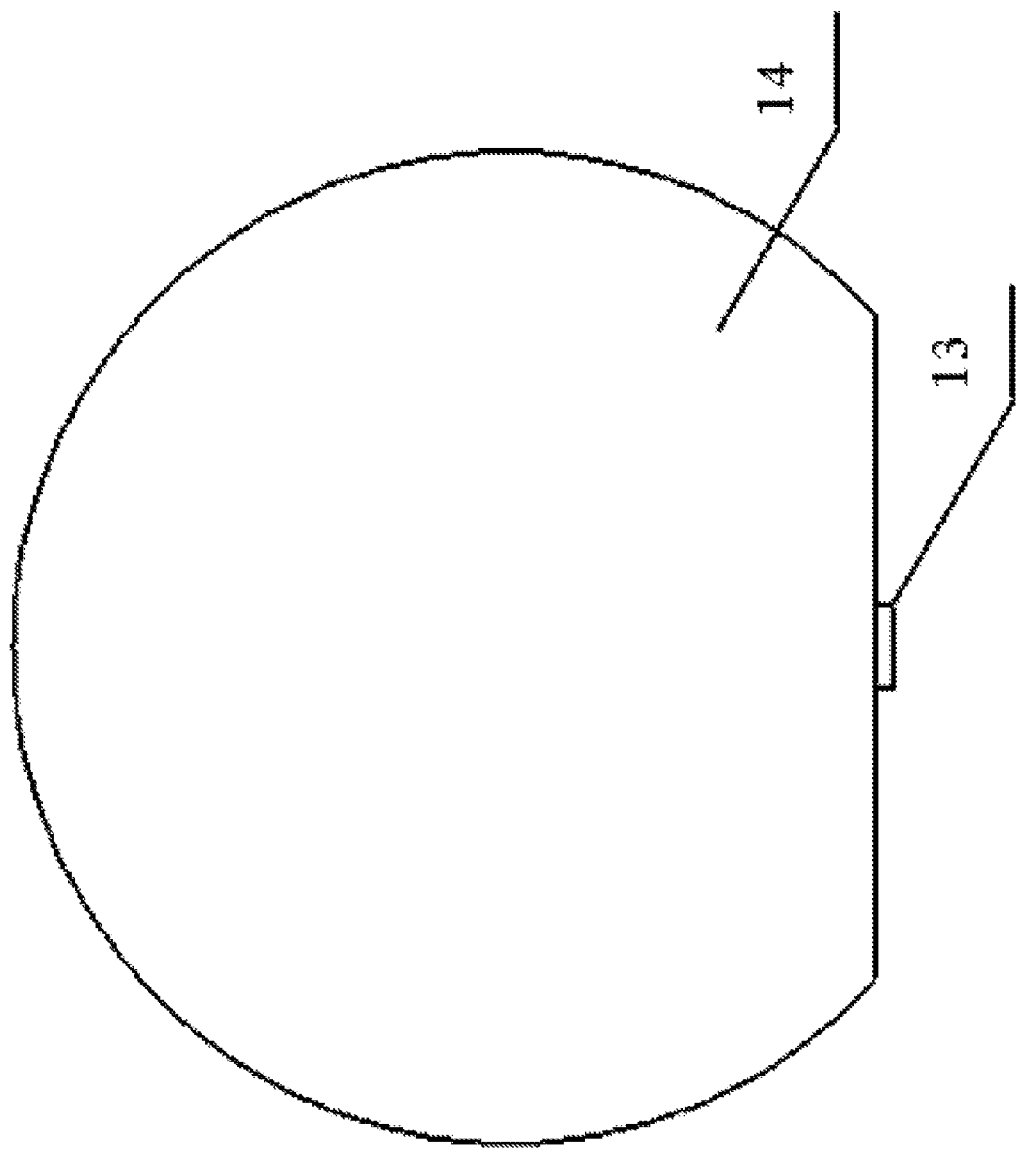
FIG. 4 is a front view of the bistable piezoelectric cantilever vibration energy generator based on spherical composite structure and partial separation of different layers.
Figure 5:
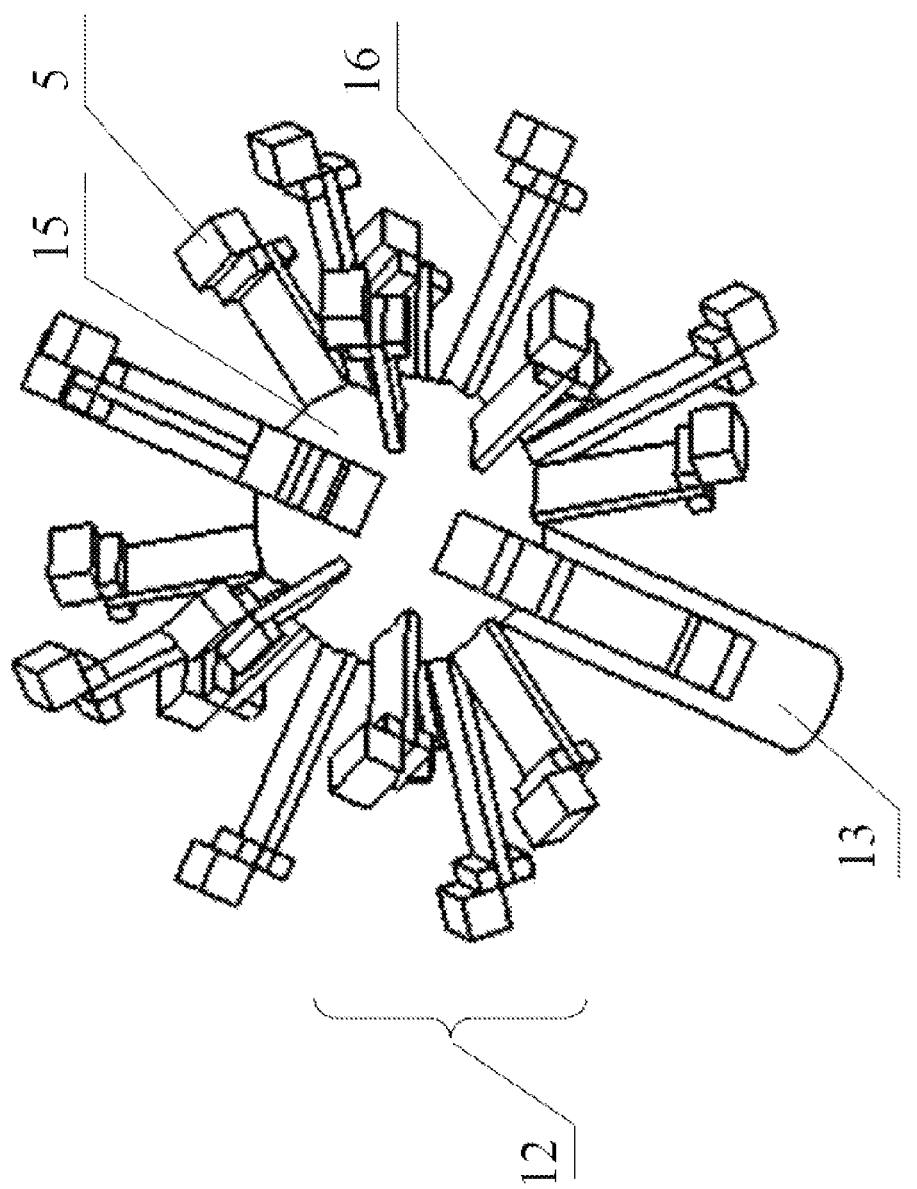
FIG. 5 is a structure diagram of a beam bracket.
Figure 6:
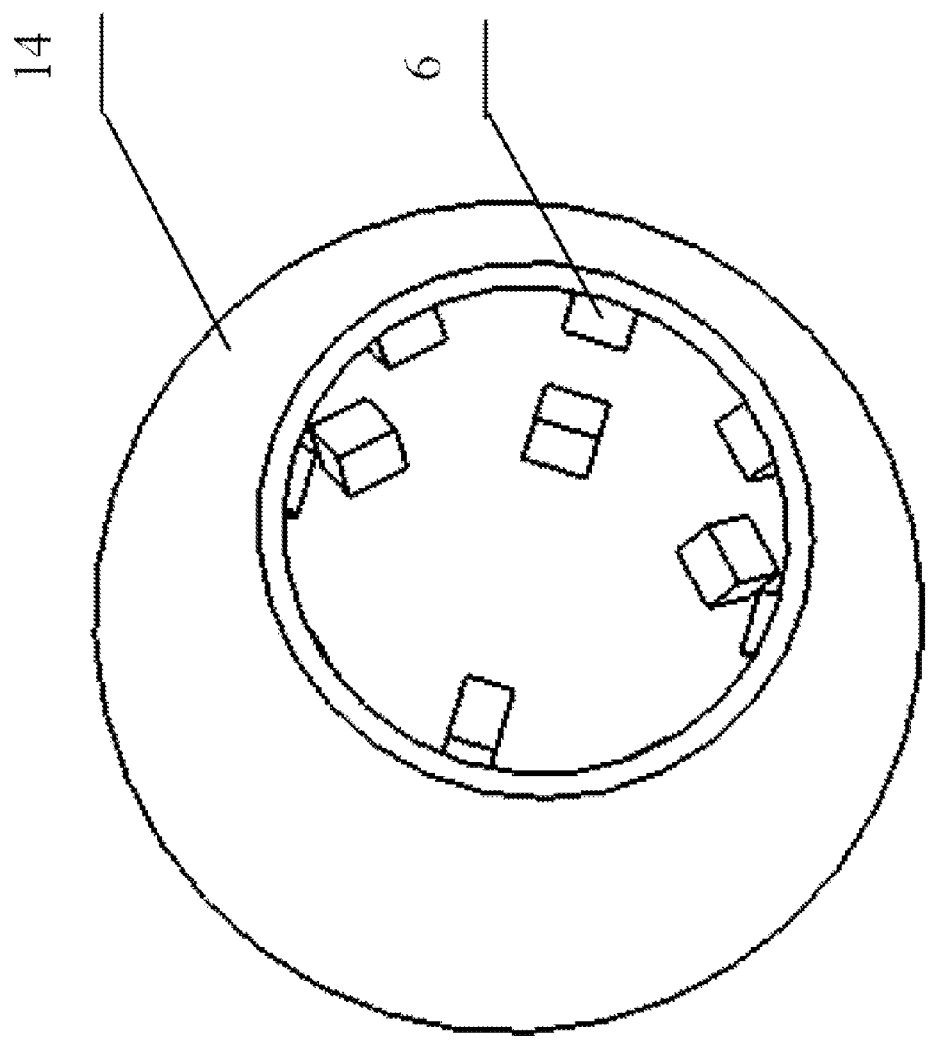
FIG. 6 is a structure diagram of a shell.
Figure 8:
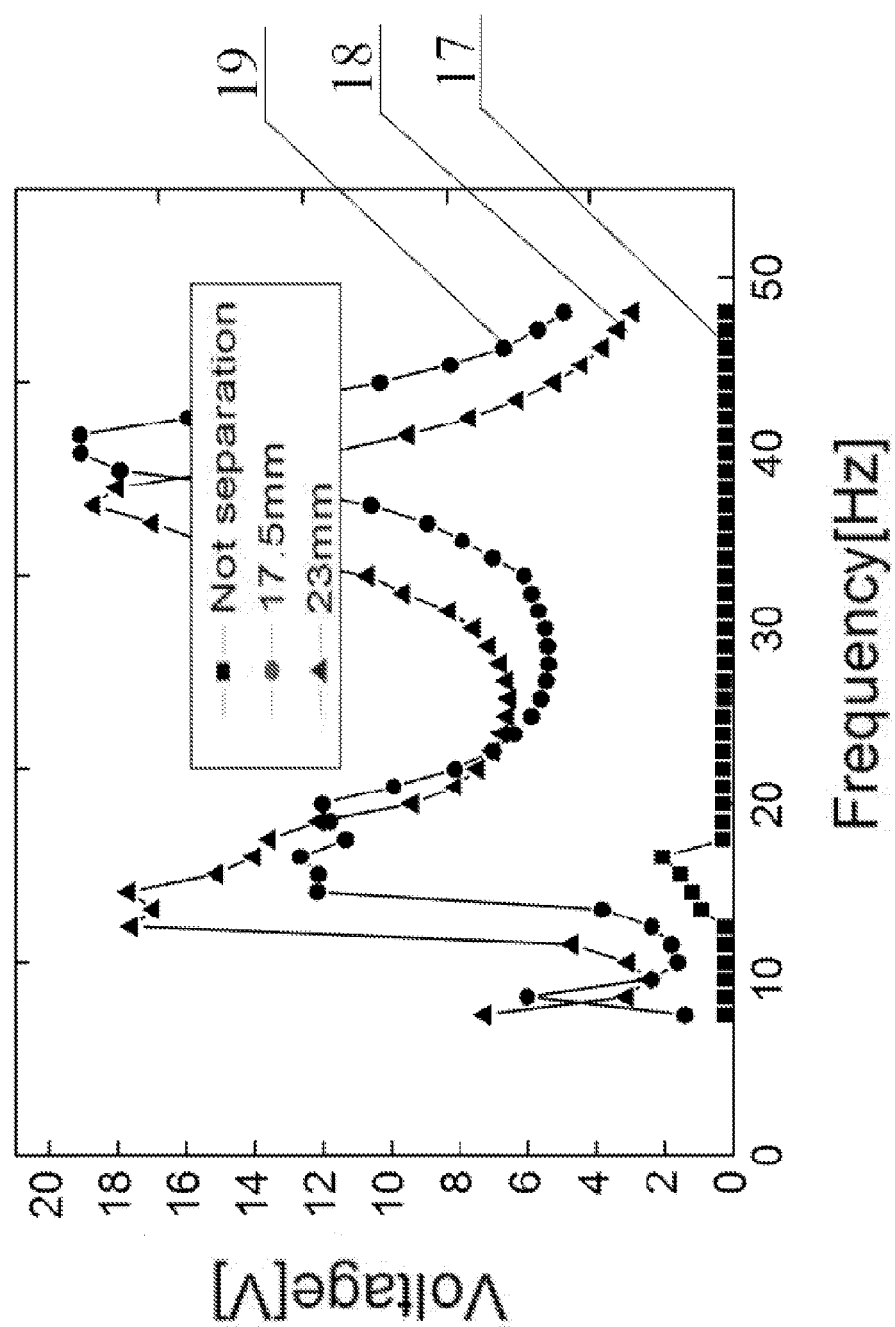
FIG. 8 is a voltage frequency response curve of a piezoelectric vibrator in the third layer under lateral external excitation with a different separate length between the first piezoelectric layer and a base layer.
Figure 9:
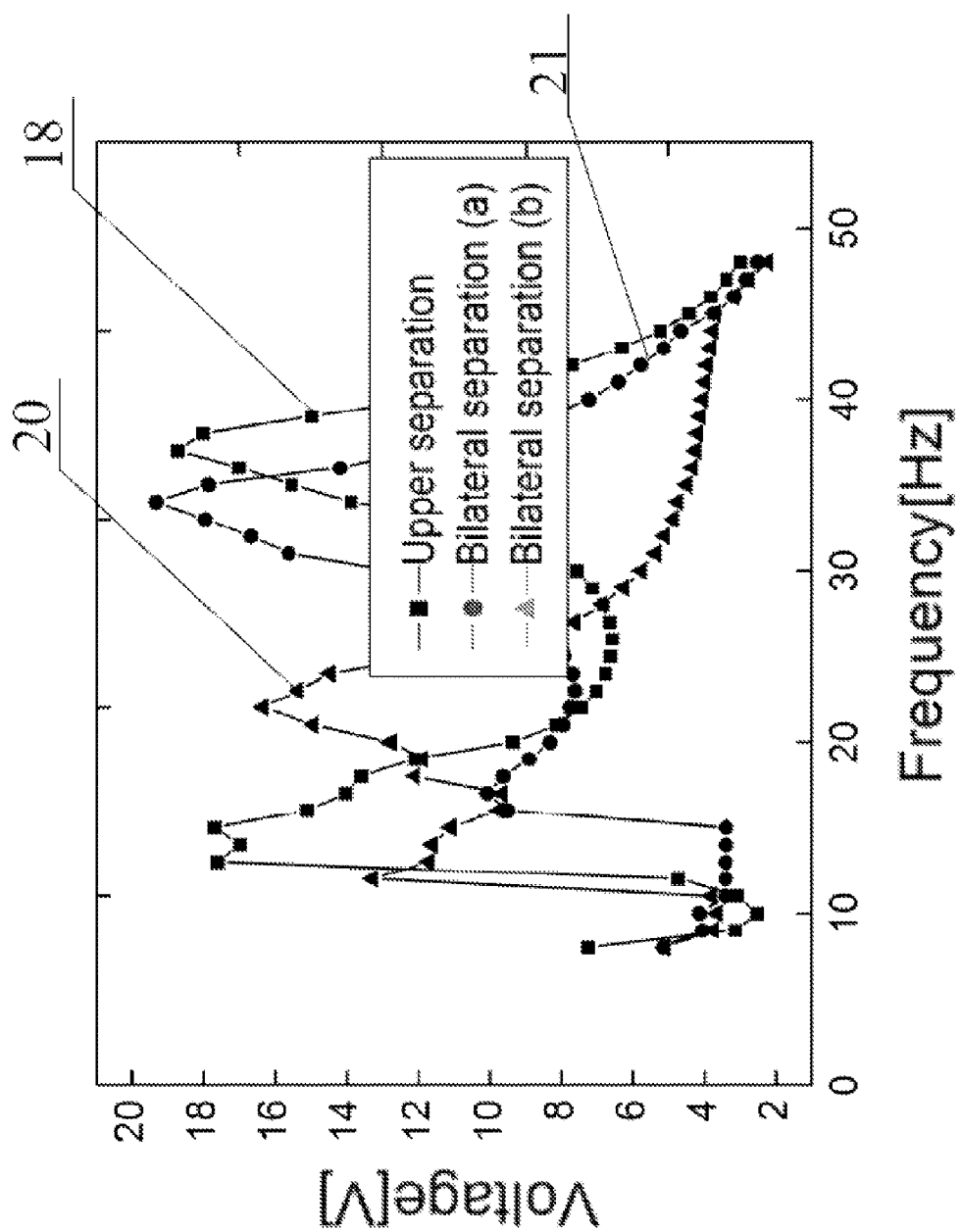
FIG. 9 is a voltage frequency response curve of the piezoelectric vibrator in the third layer under lateral external excitation with different separate situations.

In one or more of FIGS. 1-9, the following reference numbers may refer to one or more components thereof: 1. The first protective layer; 2. The lead; 3. The first piezoelectric layer; 4. The base layer; 5. The first permanent magnet; 6. The second permanent magnet; 7. The second protective layer; 8. The second piezoelectric layer; 9. The electrode; 10. The first mass; 11. The second mass; 12. The beam bracket; 13. The support bar; 14. The shell; 15. The fixed ball; 16. The piezoelectric cantilever beam; 17. The voltage frequency response curve of the piezoelectric cantilever beam without separation; 18. The voltage frequency response curve of the piezoelectric cantilever beam with the separate length of 23 Millimeters (mm) between the first piezoelectric layer and the base layer; 19. The voltage frequency response curve of the piezoelectric cantilever beam with the separate length of 17.5 mm between the first piezoelectric layer and the base layer; 20. The voltage frequency response curve of the piezoelectric cantilever beam with the separate length of 23 mm between the first piezoelectric layer and the base layer and the separate length of 23 mm between the second piezoelectric layer and the base layer; 21. The voltage frequency response curve of the piezoelectric cantilever beam with the separate length of 23 mm between the first piezoelectric layer and the base layer and the separate length of 23 mm between the second piezoelectric layer and the base layer. In addition, the mass is cut into two pieces with the same size and paste on the upper surface and lower surface of the beam.

DETAILED DESCRIPTION OF THE PREFERRED EMBODIMENTS

As shown from FIG. 1 to FIG. 9, the bistable piezoelectric cantilever vibration energy generator based on spherical composite structure and partial separation of different layers, wherein: the structure of this present disclosure includes a beam bracket (12) and a shell (14). The shell (14) is spherical, the bottom of the shell has a circular opening. The beam bracket (12) and the shell (14) are fixed to the base respectively.

The beam bracket (12) includes a support bar (13), a fixed ball (15) and a piezoelectric cantilever beam (16). The fixed ball (15) is fixedly connected to the piezoelectric cantilever beam (16), the support bar (13) supports the fixed ball (15), and the support bar (13) is fixedly connected to the fixed balls (15). The number of the piezoelectric cantilever beam (16) is twenty-five, divided into four layers, the first layer has only one piezoelectric cantilever beam (16), the second layer, third layer and the fourth layer has eight piezoelectric cantilever beams (16) respectively, the piezoelectric cantilever beams (16) of different layers are circular uniform distribution. The support bar (13) is the support structure of the beam bracket (12), the support bar (13) is provided in fixed ball (15) and in the side far away with the piezoelectric cantilever (16) of the first layer, the support bar (13) fixedly connected to the fixed ball (15) through the circular opening at the bottom of the shell (14).

The bistable piezoelectric cantilever vibrator structure may include a piezoelectric cantilever beam (16) and a permanent magnet. The piezoelectric cantilever beam (16) includes the first protective layer (1), the lead (2), the first piezoelectric layer (3), the base layer (4), the second protective layer (7), the second piezoelectric layer (8) and the electrode (9). Wherein, the order of the layers are the first protective layer (1), the first piezoelectric layer (3), the base layer (4), the second piezoelectric layer (8), and the second protective layer (7). The layers are pasted together. The first protective layer (1) and the first piezoelectric layer (3) are completely pasted together, the first piezoelectric layer (3) and the base layer (4) are incompletely pasted together and separated at the end of the beam. The second protective layer (7) and the second piezoelectric layer (8) are completely pasted together, the second piezoelectric layer (8) and the base layer (4) are incompletely pasted together and separated at the end of the beam. The length of the separation section is about 20% to 50% of the total length. The first mass (10) is pasted on the surface of the first protective layer (1) of the piezoelectric cantilever beam (16), the second mass (11) is pasted on the surface of the second protective layer (7) of the piezoelectric cantilever beam (16). The lead (2) is linked from the electrode (9) is, the electric charge generated by the deformation of the piezoelectric cantilever beam (16) will gather on the electrodes (9), the lead (2) boots out the electric charge from the electrode (9) and produces the electric current.

The permanent magnets includes the first permanent magnet (5) and the second permanent magnet (6). An aspect of the first mass (10) that keeps away from the fixed side of the cantilever pasted with a first permanent magnet (5), the second permanent magnet (6) is disposed opposite with the first permanent magnet (5). The first permanent magnet (5) and the second permanent magnet (6) are rectangular magnets and mutually exclusive. The second permanent magnet (5) is fixed to the inner wall of the shell (14).

The piezoelectric cantilever beam (16) is a symmetrical structure, the length of the first protective layer (1) is equal to that of the second protective layer (7), the width of the first protective layer (1) is equal to that of the second protective layer (7), the length of the first piezoelectric layer (3) is equal to that of the second piezoelectric layer (8), the width of the first piezoelectric layer (3) is equal to that of the second piezoelectric layer (8). The length of the first piezoelectric layer (3) is equal to that of the base layer (4), the width of the first piezoelectric layer (3) is equal to that of the base layer (4), the purpose is to facilitate to paste and obtain a larger piezoelectric area. The length and width of the first protective layer (1) are greater than that of the first piezoelectric layer (3). The bistable piezoelectric vibrators which are mutually symmetrical with each other with the same parameters, the bistable piezoelectric vibrators which are adjacent to each other with the different parameters. The length of the piezoelectric cantilever beam (16) on the first layer is equal to that of the piezoelectric cantilever beams (16) on the third layer, the width of the piezoelectric cantilever beam (16) on the first layer is equal to that of the piezoelectric cantilever beams (16) on the third layer. The lengths of the piezoelectric cantilever beams (16) on the second layer are equal to that of the piezoelectric cantilever beams (16) on the forth layer, the widths of the piezoelectric cantilever beams (16) on the second layer are equal to that of the piezoelectric cantilever beams (16) on the forth layer.

The lengths of the piezoelectric cantilever beams (16) on the first layer are different with that of the piezoelectric cantilever beams (16) on the third layer, the widths of the piezoelectric cantilever beams (16) on the first layer are different with that of the piezoelectric cantilever beams (16) on the third layer.

The piezoelectric cantilever vibrators on the same layer are connected in series, the piezoelectric cantilever vibrators on the different layer are connected in parallel.

The separate length between the first protective layer (1) and the first piezoelectric layer (3) is about 20% to 50% of the total length of the first piezoelectric layer (3), the separate length between the second protective layer (7) and the second piezoelectric layer (8) is about 20% to 50% of the total length of the first piezoelectric layer (3).

The material of the first protective layer (1) and the second protective layer (7) is polyester. The material of the first piezoelectric layer (3) and the second piezoelectric layer (8) is the polarized PVDF or the piezoelectric fiber composites. The material of the base layer (4) is one of the brass, the copper, the steel, the aluminum and the aluminum alloys. The size of the piezoelectric cantilever beam (16), the size of the first permanent magnet (5) and the second permanent magnet (6) and the distance between the first permanent magnet (5) and the second permanent magnet (6) can be adjusted by the actual situation.

When the piezoelectric generator vibrates, the beam bracket (12), the structures fixed on the beam bracket (12) and the shell (14) vibrate, the piezoelectric cantilever beam (16) will have a relatively large amplitude, the deformation of the piezoelectric cantilever beam (16) will make the deform of the piezoelectric layer. The piezoelectric layer generates polarization distortion, the positive and negative charge separation, and attach on both sides of the piezoelectric layer, the lead (2) drawn the current.

When the piezoelectric generator vibrates, the first protective layer (1), the first piezoelectric layer (3), the second protective layer (7), the second piezoelectric layer (8) all vibrate. When the base layer (4) is moved to the maximum displacement, the first protective layer (1), the first piezoelectric layer (3), the second protective layer (7), the second piezoelectric layer (8) will continue move, thus the first piezoelectric layer (3), the second piezoelectric layer (8) will produce secondary deformation, and there exist the coupling between the two deforms.

The experiments prove that: for a single piezoelectric vibrator cantilever vibrator, the structure with the partial separation has advantages over the structure without separation, the effective working frequency domain of the former increased by five times, the effective power-generating capacity of the former increased by ten times.

In summary, the present disclosure that the bistable piezoelectric cantilever vibration energy generator based on spherical composite structure and partial separation of different layers has a wide working frequency domain. Comparing with ordinary composite piezoelectric cantilever structure, its power generation efficiency increases obviously.

The present disclosure that the bistable piezoelectric cantilever vibration energy generator based on spherical composite structure and partial separation of different layers can be used in micro-electronic products, such as wireless sensor nodes, aircraft and satellite components.

What is claimed is:

1. A bistable piezoelectric cantilever vibration energy generating device comprising:
a spherical composite structure comprising one or more partial separations of multiple layers, the spherical composite structure comprising:
a beam bracket,
a shell, the shell being spherical, a bottom of the shell having a circular opening, the beam bracket and the shell fixed to a base respectively, the beam bracket comprising:
a support bar,
a fixed ball, and
a piezoelectric cantilever beam, the fixed ball fixedly connected to the piezoelectric cantilever beam, the support bar supporting the fixed ball, the support bar fixedly connected to the fixed ball, the piezoelectric cantilever beam having twenty-five beams and divided into four layers, the four layers comprising:
a first layer having a beam,
a second layer, third layer and the fourth layer that have eight beams respectively, the piezoelectric cantilever beam of different layers being in a circular uniform distribution, the support bar being a support structure of the beam bracket, the support bar provided in fixed ball and in the side far away with the piezoelectric cantilever beam of the first layer, the support bar fixedly connected to the fixed ball through the circular opening at the bottom of the shell, and
a bistable piezoelectric cantilever vibrator structure comprising:
the piezoelectric cantilever beam, and
a permanent magnet, the piezoelectric cantilever beam comprising a first protective layer, a lead, a first piezoelectric layer, a base layer, a second protective layer, a second piezoelectric layer and an electrode, an order of the layers being the first protective layer, the first piezoelectric layer, the base layer, the second piezoelectric layer, and the second protective layer, the layers pasted together, the first protective layer and the first piezoelectric layer completely pasted together, the first piezoelectric layer and the base layer incompletely pasted together and separated at the end of the piezoelectric cantilever beam, the second protective layer and the second piezoelectric layer completely pasted together, the second piezoelectric layer and the base layer incompletely pasted together and separated at the end of the piezoelectric cantilever beam, the length of the separation section being about 20% to about 50% of a total length of the second piezoelectric layer, the first mass pasted on the surface of the first protective layer of the piezoelectric cantilever beam, a second mass pasted on the surface of the second protective layer of the piezoelectric cantilever beam, the lead linked from the electrode, electric charge generated by deformation of the piezoelectric cantilever beam gathering on the electrodes, the lead booting out the electric charge from the electrode and producing the electric current, the permanent magnets comprising:
a first permanent magnet, and
a second permanent magnet, an aspect of the first mass that keeps away from a fixed side of the cantilever pasted with a first permanent magnet, the second permanent magnet disposed opposite with the first permanent magnet, the first permanent magnet and the second permanent magnet being rectangular magnets and mutually exclusive, the second permanent magnet fixed to an inner wall of the shell, wherein:
the piezoelectric cantilever beam is a symmetrical structure capable of facilitating to paste and obtain a piezoelectric area,
a length of the first protective layer is equal to a length of the second protective layer,
a width of the first protective layer is equal to a width of the second protective layer,
a length of the first piezoelectric layer is equal to a length of the second piezoelectric layer,
a width of the first piezoelectric layer is equal to a width of the second piezoelectric layer,
a length of the first piezoelectric layer is equal to a length of the base layer,
a width of the first piezoelectric layer is equal to a width of the base layer,
a length and width of the first protective layer are greater than a length and width of the first piezoelectric layer,
multiple bistable piezoelectric vibrators of the bistable piezoelectric cantilever vibrator structure that are mutually symmetrical with each other have same parameters,
the multiple bistable piezoelectric vibrators of the bistable piezoelectric cantilever vibrator structure that are adjacent to each other have the different parameters,
lengths of beams of the piezoelectric cantilever beam on the first layer is equal to lengths of beams of the piezoelectric cantilever beam on the third layer,
widths of beams of the piezoelectric cantilever beam on the first layer is equal to widths of beams of the piezoelectric cantilever beam on the third layer,
lengths of beams of the piezoelectric cantilever beam on the second layer are equal to lengths of beams of the piezoelectric cantilever beam on the forth layer,
widths of beams of the piezoelectric cantilever beam on the second layer are equal to widths of beams of the piezoelectric cantilever beam on the forth layer,
length of beam of the piezoelectric cantilever beam on the first layer is different with lengths of beams of the piezoelectric cantilever beam on the third layer,
widths of beams of the piezoelectric cantilever beam on the first layer is different with widths of beams of the piezoelectric cantilever beam on the third layer,
the multiple piezoelectric cantilever vibrators of the bistable piezoelectric cantilever vibrator structure on the same layer are connected in series, and the multiple piezoelectric cantilever vibrators of the bistable piezoelectric cantilever vibrator structure on the different layer are connected in parallel.

2. The bistable piezoelectric cantilever vibration energy generating device of claim 1, wherein a separate length between the first protective layer and the first piezoelectric layer is about 20% to about 50% of a total length of the first piezoelectric layer, and the separate length between the second protective layer and the second piezoelectric layer (8) is about 20% to 50% of the total length of the first piezoelectric layer.

3. The bistable piezoelectric cantilever vibration energy generating device of claim 1, wherein the first protective layer and the second protective layer comprise polyester that includes polarized PVDF or piezoelectric fiber composites, the base layer comprises at least one of brass, copper, steel, aluminum or an aluminum alloy, and sizes of the piezoelectric cantilever beam, the first permanent magnet and the second permanent magnet and distance between the first permanent magnet and the second permanent magnet are adjustable.

4. The bistable piezoelectric cantilever vibration energy generating device of claim 1, wherein when the bistable piezoelectric cantilever vibration energy generating device vibrates, the piezoelectric cantilever beam have a larger amplitude that the structures fixed on the beam bracket and the shell vibrate do, deformation of the piezoelectric cantilever beam deforms the piezoelectric layer, a piezoelectric layer generates polarization distortion to separate positive and negative charges and to attach on both sides of the piezoelectric layer, and the lead induces the current.

5. The bistable piezoelectric cantilever vibration energy generating device of claim 1, wherein when the bistable piezoelectric cantilever vibration energy generating device vibrates, the first protective layer, the first piezoelectric layer, the second protective layer, and the second piezoelectric layer vibrate, when the base layer is moved to the maximum displacement, the first protective layer, the first piezoelectric layer, the second protective layer, and the second piezoelectric layer move continuously such that the first piezoelectric layer and the second piezoelectric layer produce secondary deformation coupling first deformation.

* * * * *